United States Patent [19]

Saro

[11] Patent Number: 5,719,569
[45] Date of Patent: Feb. 17, 1998

[54] CODER FOR MEASURING RELATIVE MOVEMENTS BETWEEN TWO OBJECTS

[75] Inventor: Miguel Saro, Seyssinet, France

[73] Assignee: Commissariat a l'Energie Atomique, Paris, France

[21] Appl. No.: 437,958

[22] Filed: May 10, 1995

[30] Foreign Application Priority Data

Jun. 1, 1994 [FR] France ................................ 94 06691

[51] Int. Cl.$^6$ ........................................... H03M 1/22
[52] U.S. Cl. ................................... 341/13; 341/11
[58] Field of Search ............................. 341/3, 7, 9, 10, 341/11, 13, 15

[56] References Cited

U.S. PATENT DOCUMENTS

| | | | |
|---|---|---|---|
| 4,551,676 | 11/1985 | Amemiya et al. | |
| 4,584,472 | 4/1986 | Wiblin et al. | 250/237 |
| 4,999,623 | 3/1991 | Affa | 341/13 |
| 5,206,645 | 4/1993 | Urich | 341/11 |

FOREIGN PATENT DOCUMENTS

| | | |
|---|---|---|
| 0087536 | 9/1983 | European Pat. Off. |
| 4028792 | 3/1991 | Germany. |

OTHER PUBLICATIONS

Electronic Engineering, "Improved Optical Shaft Encoder Resolution", Petrice, vol. 59, No. 731, Nov. 1987, London GB, pp. 37-38.

Primary Examiner—Jeffrey A. Gaffin
Assistant Examiner—Thuy-Trang N. Huynh
Attorney, Agent, or Firm—Pearne, Gordon, McCoy & Granger LLP

[57] ABSTRACT

A coder includes a measuring rule (R3) carried by one object and having at least two tracks (X, Y). The tracks are provided with simple marks distributed in a substantially identical manner over the two tracks. At least two specific marks (M1, M2) are located on two distinct tracks. Each mark limit defines a spacing change on the measuring rule. At least two mark readers (LX, LY) are carried by another object, each associated with a track whose marks it detects. A processor is connected to the readers for determining the distance and direction of the movement. The invention is useful in robotics and metrology.

5 Claims, 5 Drawing Sheets

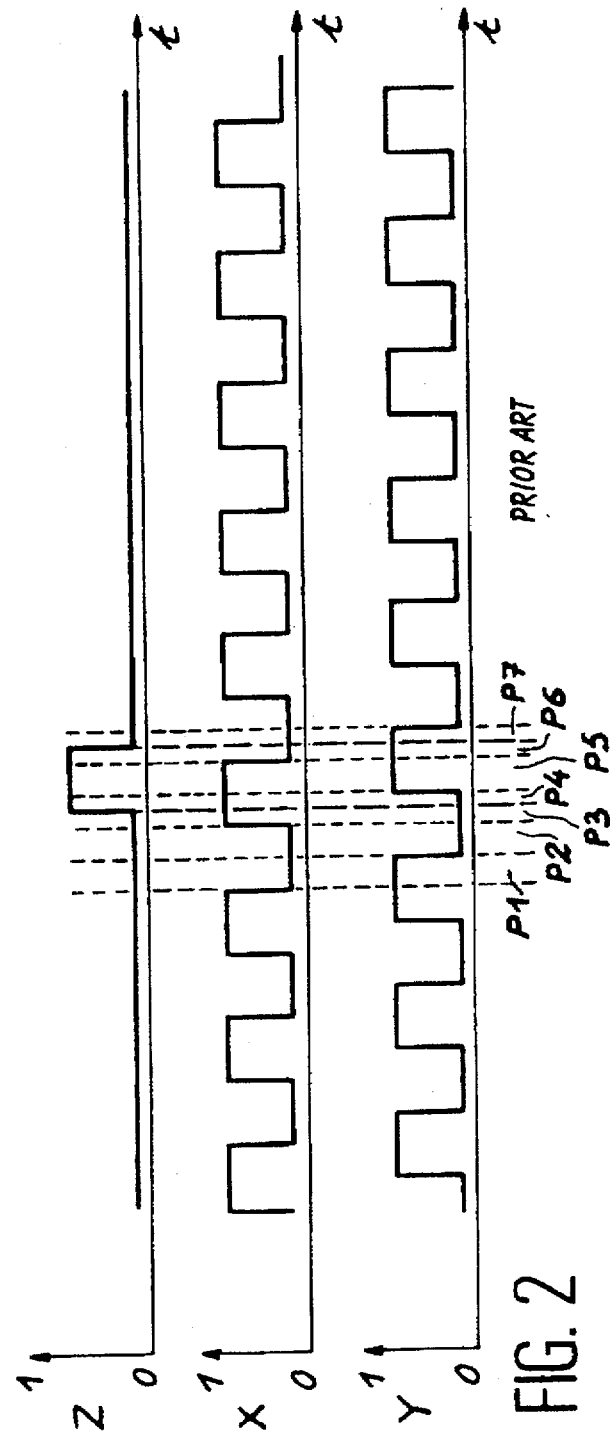

TRACK X
TRACK Y
TRACK Z

CODER FOR MEASURING RELATIVE MOVEMENTS BETWEEN TWO OBJECTS

DESCRIPTION

1. Technical Field

The present invention relates to a coder making it possible to measure relative movements between two objects.

The invention is more particularly used in the field of robotics (for the movement of robots) or in the field of metrology.

2. Prior Art

For measuring relative movements between two objects, it is known to perform displacement or movement measurements using coders or encoders. These coders are usually linear coders or angular coders having on the one hand a scale rule (also called a measuring rule or simply a rule) carried by one of the objects and, on the other hand, at least one reader carried by the other object.

The scale rule of the coder has a plurality of tracks or channels on which are inscribed graduations, normally known as marks and which can be of different types, e.g. optical marks, magnetic marks, etc. No matter what the type used, said marks are coded on tracks of the rule according to a code, which can be the GRAY code, the JOHNSON code, the pure binary code or any other code.

In more general terms, the presently known coders are subdivided into two major groups, namely absolute coders and incremental coders. This coder subdivision has been made as a function of the information type which each coder is able to supply.

An absolute coder or encoder supplies an information corresponding to the position of the reader on the measuring rule. In addition, each graduation of the rule is identified in a unique manner so as not to be confusible with any other graduation. In this case, the reader reads the identification on the rule.

An incremental coder or encoder supplies an elementary information whenever the reader/rule position varies by one graduation. In addition, all the graduations carry the same information and, for recognizing the displacements between the reader and the rule, it is necessary to count the number of informations read by the reader. In practice, the elementary information is inadequate. Moreover, commercial incremental coders generally have at least three information channels, also known as "tracks". One of these tracks supplies a pulse during the passage of the reader in front of a reference point of the rule, called "TOP ZERO". The other tracks make it possible to obtain informations relative to the displacement and displacement direction of the objects.

An incremental coder of the previously described type is e.g. manufactured and marketed by SUNX, Tokyo, Japan.

The theoretical structure of such a three track, incremental coder is shown in FIG. 1A. FIG. 1A shows an incremental coder with three tracks:

a track X and a track Y containing different marks making it possible to obtain information on the displacement and direction of the movement of the objects, a track Z containing the mark of the "TOP ZERO".

FIG. 1A also shows the readers associated with each of the tracks:

the reader LX associated with the track X, the reader LY associated with the tracks Y, the reader LZ associated with the track Z and therefore able to detect the mark of the TOP ZERO, i.e. the representative mark of the reference point of the measuring rule R1.

1, 2, 3, 4, 5, 6 and 7 designate the limits of the marks of each of the tracks X, Y and Z of the measuring rule R1. More specifically, 1 is a mark end limit of track X, 4 a mark start limit of track X and 7 a mark end limit of track X. Reference 2 represents a mark end limit of track Y and 5 a mark start limit of track Y. In parallel, references 3 and 6 represent limits, respectively of the start and end of the TOP ZERO mark of the track Z.

Thus, each start limit or end limit of the tracks X or Y indicates a change of spacing or pitch on the measuring rule R1. It is clear that a spacing is a graduation of the measuring rule R1 and that the spacings of a rule are a function of the set of tracks constituting said rule, other than the TOP ZERO track.

Thus, the readers LX, LY and LZ detect each of the marks on the tracks X, Y and Z and supply electrical signals representative of the marks read. For a better processing of these signals, a signal amplifier AX, AY or AZ is connected to the output of each reader (cf. FIG. 1B). The output of each amplifier AX, AY, AZ is itself connected to the input of an analog/digital ("A/D") converter, respectively GX, GY, CZ (also called former), which is able to transform the amplified electrical signals into level 0 or 1 logic signals.

The outputs of commercially available coders correspond to the outputs of the A/D converters. However, analysis means can be connected to these outputs of the A/N converters.

FIG. 1B shows an example of said analysis means CL with respect to the signals from the A/D converters. These analysis means CL have a Boolean logic generating, using the output signals of the A/D converters, a TOP ZERO signal which resets a reversible counter, a displacement direction signal which reverses the counting direction of the reversible counter and a spacing signal which is used as a reversible counting clock.

The value (in number of spacings) of the displacement with respect to the TOP ZERO is available on the digital outputs of the reversible counter. This value can be coded or encoded in any random digital base (e.g. decimal, hexadecimal, etc.).

FIG. 2 shows the timing diagram obtained for the incremental coder shown in FIG. 1A, i.e. the timing diagrams obtained for each of the three tracks X, Y and Z.

Thus, each of the timing diagrams X, Y and Z shows the signals obtained in time for each of the respective tracks Z, Y and X. As can be seen in FIG. 2, timing diagram Z only has a single signal representing the TOP ZERO mark read on the track Z of FIG. 1A by the reader LZ. The timing diagrams Y and X show a plurality of signals, each representative of the marks read respectively by the readers LX and LY on the tracks X and Y.

In FIG. 2 the reference P1 designates the spacing between the mark limit 1 and the mark limit 2 shown in FIG. 1A. Reference P2 represents the spacing between the mark limit 2 and the mark limit 4 in FIG. 1A. As can be seen in FIG. 2, the reference P3 represents a half-spacing between the mark limit 4 of the track X and the limit 3 of the TOP ZERO mark on the track Z and reference P4 represents the half-spacing between the mark limit 3 of the TOP ZERO mark and the mark limit 5 on the track Y. The mark start limit of the TOP ZERO thus causes half-spacings on the rule R1. In the same way, the mark end limit of the TOP ZERO on the track Z causes the half-spacings P6 and P7. The spacing P5 is defined by the limits 5 and 7.

Thus, FIGS. 1A and 2 show that there is a very significant information quantity difference between the TOP ZERO track Z and the other tracks X and Y of the coder. Therefore the readers LX and LY read a plurality of repetitive marks, whereas the reader LZ only reads a single mark. However, it has been found that the readers react differently as a function of the density of information read, i.e. of the quantity of marks on a track. In particular magnetic readers react very badly to isolated informations of the TOP ZERO type.

Moreover, for electronic processing reasons, the signals obtained at the output of the coders must not simultaneously change state. This makes it necessary to position the TOP ZERO mark on half-spacings, as shown in FIGS. 1A and 2. Thus, the precision of the positioning of the TOP ZERO mark is double the precision of the other spacings.

It is therefore difficult to implement such an incremental coder as a result of this double precision of the positioning of the TOP ZERO mark.

DESCRIPTION OF THE INVENTION

The object of the present invention is to obviate these disadvantages. To this end it proposes a coder or encoder making it possible to measure relative movements between two objects and for which the spacing change informations are distributed over all the tracks of the measuring rule and for which the TOP ZERO is coded with at least two marks on at least two tracks of the measuring rule.

More specifically, the present invention relates to a coder for measuring relative movements between a first and a second objects. This coder comprises:

a measuring rule carried by the first object and having at least two tracks, each provided with a plurality of marks;

at least two readers of marks carried by the second object, each of the tracks of the measuring rule being read by at least one mark reader, the latter being able to detect the marks of the track with which it is associated;

and processing means connected to the mark readers.

This coder is characterized in that all the tracks have substantially the same number of marks, that each mark has a start limit and an end limit, each defining a change of spacing on the measuring rule and that the marks of the measuring rule consist of a plurality of simple marks, all having substantially identical characteristics and at least two specific marks, respectively located on two distinct tracks of the measuring rule and each having a characteristic different from the characteristics of the simple marks, said specific marks indicating at least one reference position of the rule, the set of simple and specific marks of all the tracks defining a succession of regular spacings along the rule.

According to the invention, the specific marks have a length, in the displacement direction, greater or less than that of the simple marks the characteristic of specific marks which is different from the one of simple marks being the length, which can be looked upon as a length modulation, also called phase modulation.

According to a variant of the invention, the specific mark also has a width substantially above or below that of the simple marks.

According to yet another variant of the invention, each track of the measuring rule has a specific mark. Each of these specific marks has a length different both to the simple marks and other specific marks of the measuring rule.

According to another embodiment, a characteristic differentiating between the simple marks and the specific mark can also be the optical marking density, that is, the density of reflective or transmissive material used for marking.

Thus, such a measuring rule has a substantially identical information quantity on each of its tracks.

Advantageously, for each reader, the processing means incorporate an amplifier and at least one former for transforming the output signal of the reader into a digital signal and means for analyzing the digital signals from the formers.

The analysis means are e.g. those described in conjunction with FIG. 1B and can also be constituted by a computer.

The coder according to the invention can be used both in optics and magnetics. It makes it possible to reduce the number of marks per track, because the coding is distributed over all the tracks. As the information density is lower, the readers used can have a lower resolution and can therefore be less expensive.

BRIEF DESCRIPTION OF THE DRAWINGS

FIG. 1A already described, shows the theoretical structure of a known incremental coder having three tracks X, Y and Z.

FIG. 2, already described, shows the timing diagram of the incremental coder of FIG. 1A.

DETAILED DESCRIPTION OF EMBODIMENTS OF THE INVENTION

Figure 3:
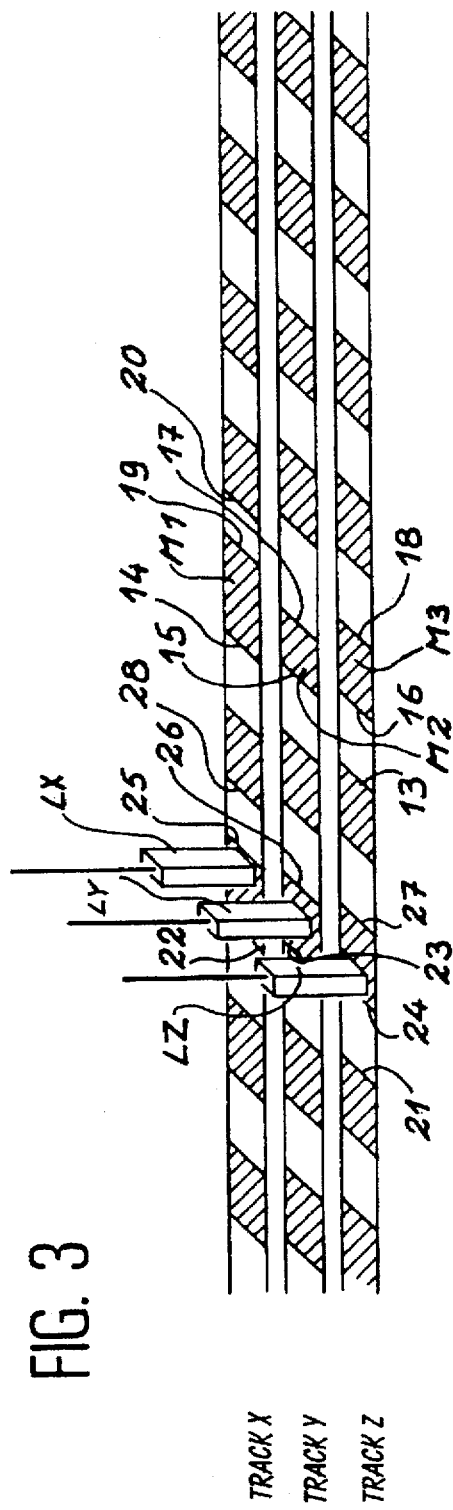
FIG. 3 shows the structure of an exemplified three-track coder according to the invention.

FIG. 3 shows the theoretical structure of an exemplified coder or encoder according to the invention having three tracks, namely X, Y and Z. Each track has a plurality of waves constituted by a mark and an unmarked space following the said mark. As the rule R5 has three tracks, each wave of said rule R5 has 3×2 spacings, i.e. six spacings. Each of these tracks X, Y or Z has a substantially equal number of marks. Thus, the definition marks of the spacings are distributed on the three tracks of the measuring rule R5.

With each of the tracks X, Y and Z is respectively associated a reader LX, a reader LY and a reader LZ, all three being able to in each case detect marks of the track with which it is associated.

For the embodiment represented in FIG. 3, the TOP ZERO is implemented by means of two specific marks distributed on the two tracks X and Y and a simple mark on the track Z of the measuring rule R5. As can be seen, these specific marks are designated M1 for the track X and M2 for the track Y and the simple mark of the track Z is designated M3.

The specific mark M1 is longer than a simple mark and the specific mark M2 shorter than a simple mark. It is in this case said that the TOP ZERO is encrypted by length modulation, also known as phase modulation.

In another embodiment, the TOP ZERO can be encrypted by further modulating the optical density of the marks. Then, these two modulations can be combined in order to permit a redundancy of the reading of the TOP ZERO.

In FIG. 3, reference numeral 13 represents the end limit of a simple mark of the track Z, reference 15 the start limit of the specific mark M2 of the track Y, 14 the start limit of the specific mark M1 of the track X, 16 the start limit of the simple mark M3 of track Z, reference 17 the end limit of mark M2 of track Y, 18 the end limit of the simple mark M3 of track Z, 19 the end limit of the specific mark M1 of track X and 20 the start limit of a simple mark of the track X.

Figure 1B:
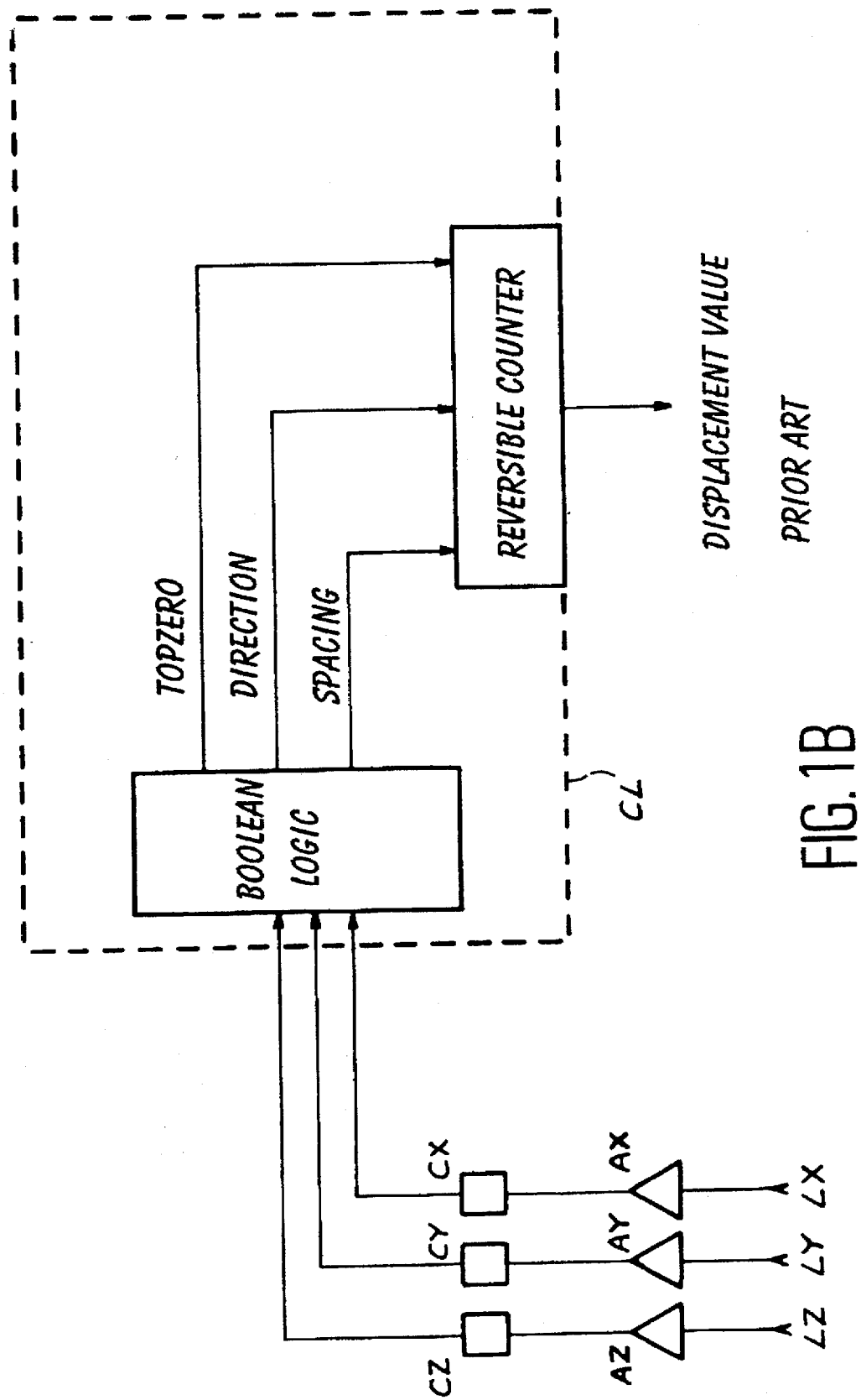
FIG. 1B, already described, diagrammatically shows the conventional processing means of the coder of FIG. 1A.

The analog signals obtained at the output of the readers LX, LY and LZ are processed with processing means like those of the aforementioned prior art. The signals are firstly amplified and then transformed into logic signals by formers. They are then supplied to analysis means, like those described with reference to FIG. 1B, or to a computer.

Figure 7:
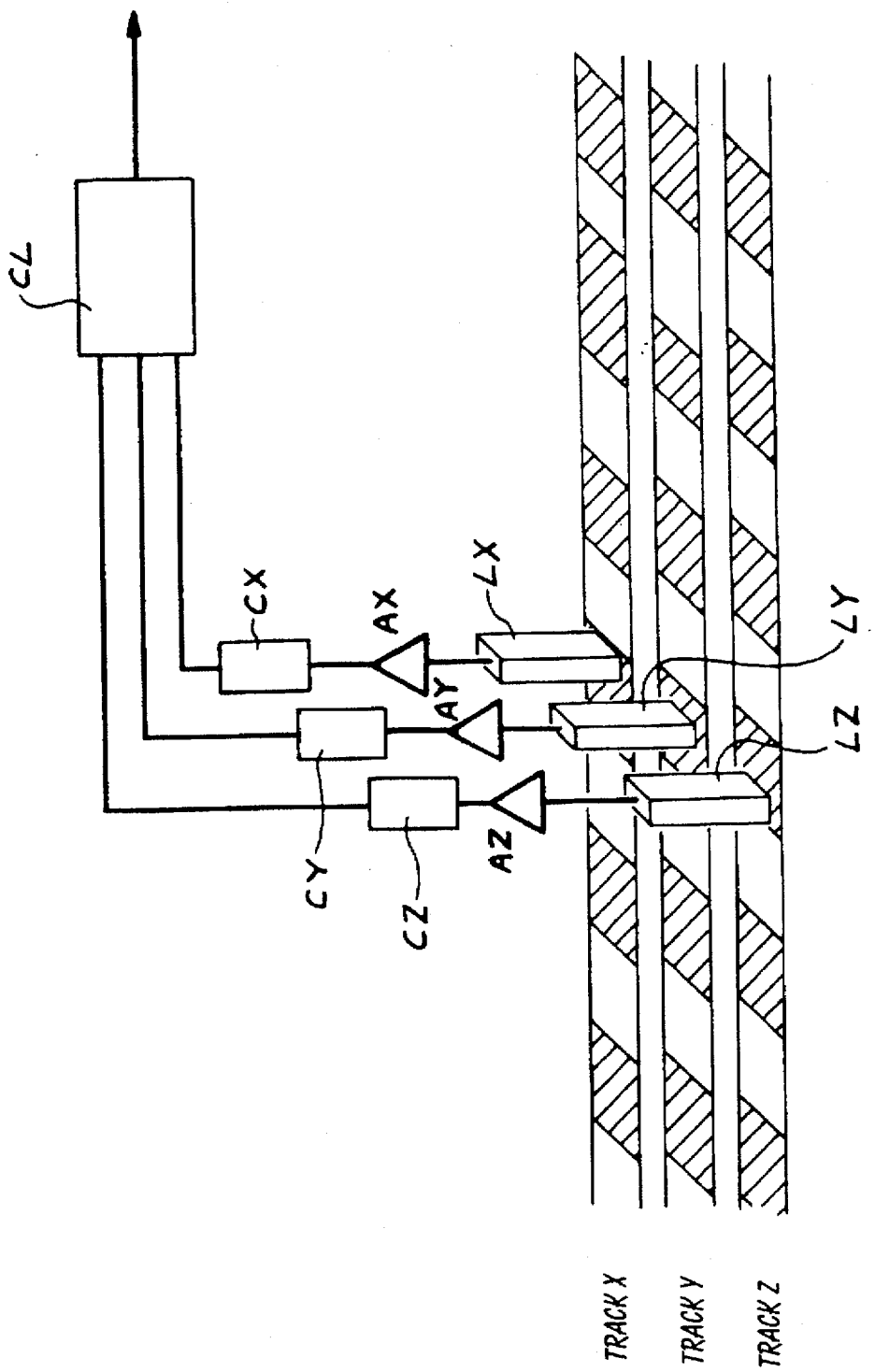
FIG. 7 diagrammatically shows the processing means of a coder according to the invention.

FIG. 7 shows a coder or encoder like that of FIG. 3, which has three tracks X, Y and Z with which are respectively associated the three readers LX, LY and LZ. FIG. 7 also diagrammatically shows the three amplifiers AX, AY and AZ followed by the three formers CX, CY and CZ. The three logic signals at the output of the formers are supplied, as described hereinbefore, to the input of the analysis means CL or to the input of a computer.

Figure 4:
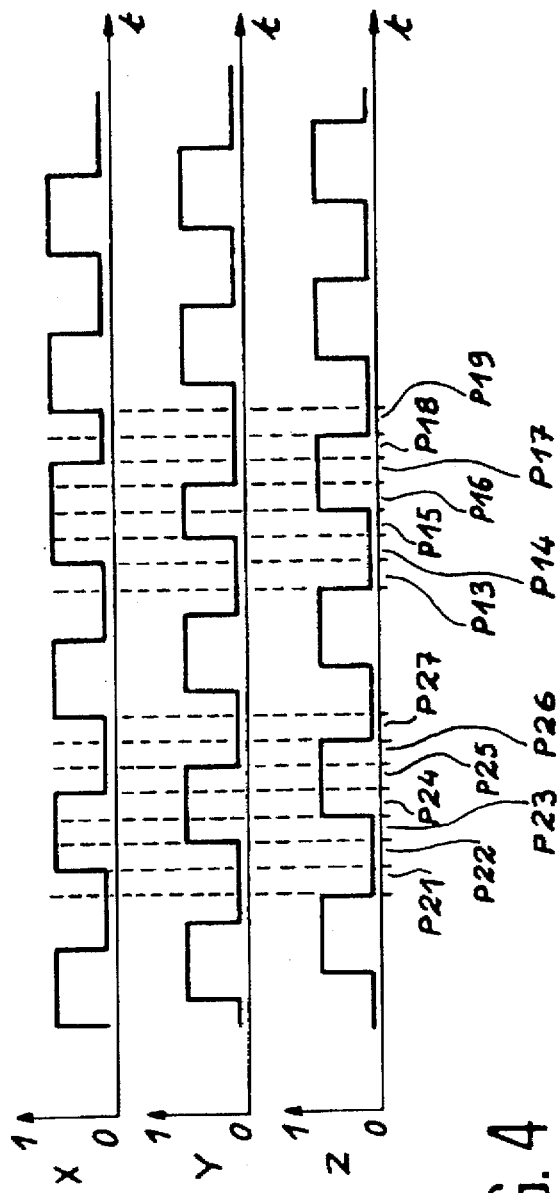
FIG. 4 shows the timing diagram obtained for the coder shown in FIG. 3.

If reference is now made to FIG. 4, it is possible to see therein the spacings P13 to P19 corresponding to the spacings implemented by the start and end limits of the marks designated 13 to 20 in FIG. 3. Thus, the spacing P13 corresponds to the spacings between the limit 13 on the track Z and the limit 14 of the specific mark M1, the spacing P14 represents the spacing between the limit 14 of the specific mark M1 and the limit 15 of the specific mark M2, P15 the spacing between the limit 15 of the specific mark M2 and the limit 16 of the specific mark M3, the spacing P16 is the spacing between the limit 16 of the specific mark M3 and the limit 17 of the specific mark M2, the spacing P17 is the spacing provided by the limit 17 of the specific mark M2 and the limit 19 of the mark M1, the spacing P18 is the spacing implemented by the limit 19 of the mark M1 and the limit 18 of the specific mark M3 and the spacing P19 is implemented by the end limit 18 of the specific mark M3 and the start limit 20 of a simple mark of the track X.

By applying a conventional binary procedure consisting of allocating the binary value $2^0$ to the signals of the timing diagram X, the value $2^1$ to the signals of the timing diagram Y and the value $2^2$ to the signals of the timing diagram Z, the following values are obtained for the spacings:

the value 0 for spacing P13;

the value 1 for spacing P14;

the value 3 for spacing P15;

the value 7 for spacing P16;

the value 5 for spacing P17;

the value 4 for spacing P18; and the value 0 for spacing P19.

It should be noted that the spacings P13 and P19 have the same value, because the wave has six spacings i.e. the wave relative to the TOP ZERO has the spacings P13 to P18 and the spacing P19 is the first spacing of the following wave relative to the TOP ZERO.

In general terms, the word "wave" is used for the repetitive set of successive spacings. In this example, the TOP ZERO wave has six spacings, i.e. 0, 1, 3, 7, 5, 4. This wave must exist at least once per revolution.

The rotation direction of the movement is supplied by the previously described electronic system and which takes account of the order of the successive states of the tracks X and Y.

FIG. 3 also shows the end limits 21, 25, 26 and 27 of the simple marks and the start limits 22, 23, 24 and 28 of the simple marks.

FIG. 4 shows the spacings P21 to P27 implemented by the start and end limits of the marks 21 to 28 and specifically:

spacing P21 is implemented by the mark end limit 21 of track Z and the mark start limit 22 of track X, spacing P22 is implemented by the mark start limit 22 of track X and the mark start limit 23 of track Y, spacing P23 is between the mark start limit 23 of track Y and the mark start limit 24 of track Z, the spacing P24 is between the mark start limit 24 of track Z and the mark end limit 25 of track X, spacing P25 is between the mark end limit 25 of track X and the mark end limit 26 of track Y, spacing P26 is between the mark end limit 26 of track Y and the mark end limit 27 of track Z, spacing P27 is between the mark end limit 27 of track Z and the mark start limit 28 of said track.

Thus, the wave formed by the spacings P21 to P26 is a so-called "normal" wave, because it has spacings implemented by mark limits of identical lengths, i.e. limits of simple marks. However, the wave implemented by the spacings P13 to P18 is a so-called "modified" wave, because it is the wave corresponding to the specific marking of the TOP ZERO of the measuring rule R5.

By attributing in accordance with conventional binary procedure the value $2^0$ to the timing diagram X, the value $2^1$ to the timing diagram Y and the value $2^2$ to the timing diagram Z, the following spacing values are obtained:

| Normal wave | Modified wave or reference TOP wave |
| --- | --- |
| P21 has the value 0 | P13 has the value 0 |
| P22 has the value 1 | P14 has the value 1 |
| P23 has the value 3 | P15 has the value 3 |
| P24 has the value 7 | P16 has the value 7 |
| P25 has the value 6 | P17 has the value 5 |
| P26 has the value 4 | P18 has the value 4 |

Thus, it can be seen that the normal wave and the modified wave do not have the same spacing values, because the fifth spacing (spacing P25) of the normal wave has the value 6 and the fifth spacing of the modified wave (spacing P17) the value 5. The detection of this value 5 consequently indicates the position of the TOP ZERO.

Thus, according to the invention, after reading the set of tracks, identical successive waves are obtained and at least one special wave corresponding to the reference TOP.

Figure 5:
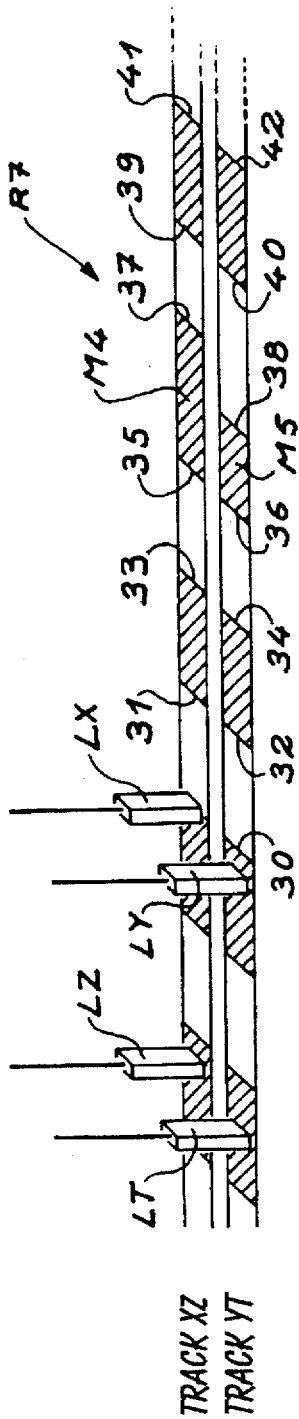
FIG. 5 shows the structure of an exemplified coder according to the invention, whose measuring rule has two tracks, with each of which are associated two readers.

FIG. 5 shows the structure of a two-track coder in accordance with another embodiment of the invention. The measuring rule R7 of said coder has a first track XZ with which are associated two readers LX and LZ and a second track YT with which are associated two readers LT and LY.

In exemplified manner, the readers can be so mutually positioned as to have a distance $(N+1/P)\cdot\lambda$ between LX and LZ on the one hand and LY and LT on the other and in which N represents an integer, P represents the total number of readers and $\lambda$ represents the length of the wave defined by the measuring rule. Moreover, the readers LX and LY on the one hand and LZ and LT on the other are displaced by $(N+\frac{1}{2}P)\cdot\lambda$. For example of FIG. 5 P=4 and N=1 have been chosen.

For this embodiment, the TOP ZERO is coded in a substantially similar manner to that of the coder shown in FIG. 5. Thus, the TOP ZERO is coded by two specific marks M4 and M5, respectively on the track XZ and the track YT. These specific marks M4 and M5 are marks having a length different from the simple marks, but with an identical width.

As in the previous drawings the mark start and end limits have been referenced, so that references 30, 33, 34, 41 and 42 represent end limits of marks on the tracks XZ and YT and references 31, 32, 39 and 40 represent start limits of simple marks on said same tracks, reference 35 represents the start limit of the specific mark M4 and 36 the start limit of the specific mark M5, whilst reference 37 represents the end limit of the specific mark M4 and reference 38 the end limit of the specific mark M5.

Figure 6:
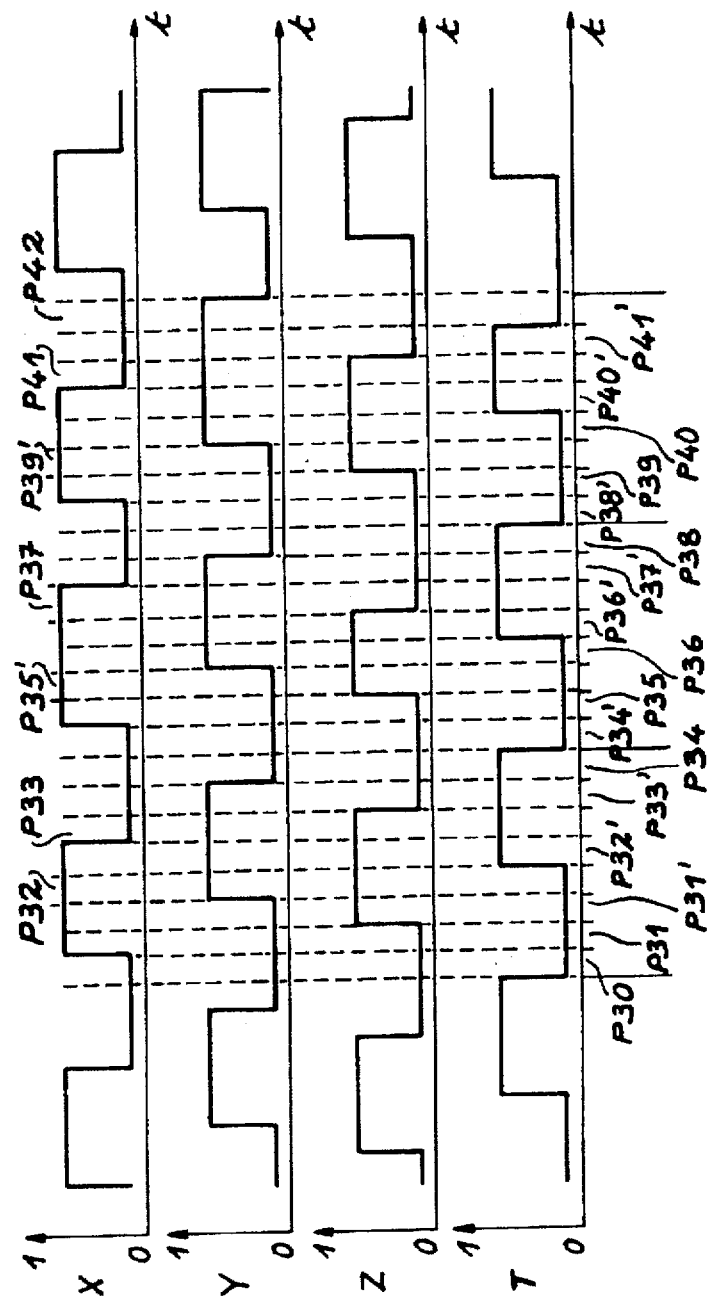
FIG. 6 shows the timing diagram obtained for the coder of FIG. 5.

FIG. 6 shows the timing diagram obtained at the output of formers associated with the readers LX, LZ, LY and LT. The timing diagram X represents the logic signal obtained at the output of the former connected to the reader LX. The same applies with respect to the timing diagrams Y, Z and T obtained at the output of the formers respectively associated with the readers LY, LZ and LT.

In FIG. 6, the references P30 to P42 are used for the spacings between the end limit of mark 30 of track YT (in FIG. 5) and the end limit of mark 42 on said track YT.

On simultaneously considering FIGS. 5 and 6, it is clear that the spacings P30 to P34 constitute a normal wave, i.e. the wave between the end limit of mark 30 and the end limit of mark 34. As there are two tracks and two track readers, said wave has eight spacings. If, in the manner associated hereinbefore, the values $2^0$ are associated with X, $2^1$ with Y, $2^2$ with Z and $2^3$ with T, for said normal mark are obtained the following spacing values (calculated in hexadecimal form):

the value 0 for spacing P30;

the value 1 for spacing P31;

the value 5 for spacing P31';

the value 7 for spacing P32;

the value F for spacing P32';

the value E for spacing P33;

the value A for spacing P33'; and the value 8 for spacing P34.

The eight spacings following the spacing P34, i.e. the spacings P34' to P38, constitute a modified wave, namely the TOP ZERO wave. This wave is in fact between the simple mark end limit 34 on track YT and the end limit 38 of the specific mark M5 on track YT.

It can be seen on the timing diagram of X and the timing diagram of Y that the specific marks M4 and M5 are respectively represented by longer and shorter signals than the signals representing the simple marks. In addition, on allocating to each timing diagram X, Y, Z and T the respective values $2^0$, $2^1$, $2^2$ and $2^3$ in hexadecimal form are obtained the following values for the spacings P34' to P38 constituting the TOP ZERO wave:

the spacing P34' has the value 0;

the spacing P35 has the value 1;

the spacing P35' has the value 5;

the spacing P36 has the value 7;

the spacing P36' has the value F;

the spacing P37 has the value B;

the spacing P37' has the value A;

the spacing P38 has the value 8.

With respect to FIG. 6, it can be seen that in this embodiment the coding of TOP ZERO define two spacings corresponding on the one hand to the actual TOP ZERO and on the other to the spacing of another TOP, called "TOP ONE". The wave following the TOP ZERO wave is consequently called the TOP ONE wave and has the spacings P38' to P42.

The timing diagrams Z and T have two signals representing the specific marks M4 and M5. These signals are respectively larger and smaller than the signals representative of the simple marks. In FIG. 6 it can be calculated that the spacing difference between the TOP ZERO and the TOP ONE is ten spacings.

If, as hereinbefore, allocation takes place to X, Y, Z and T of the value $2^0$, $2^1$, $2^2$ and $2^3$ for said wave are obtained the following spacing values:

0 for spacing P38';

1 for spacing P39;

5 for spacing P39';

7 for spacing P40;

F for spacing P40';

E for spacing P41;

A for spacing P41';

2 for spacing P42.

By comparing the spacing values of the normal wave, the TOP ZERO wave and the TOP ONE wave, it can be seen that:

the value of the sixth spacing of the normal wave is E, whereas the value of the sixth spacing of the TOP ZERO wave is B, so that the TOP ZERO spacing is detected as a result of said spacing value difference, the value of the eighth spacing of the normal wave is 8, whereas the value of the eighth spacing of the TOP ONE wave is 2, so that the TOP ONE spacing is detected as a result of this spacing value difference.

Such an embodiment making it possible to detect both a TOP ZERO and a TOP ONE has the advantage of permitting a double setting of the spacing counter of the analysis means, on the one hand on a value 0 by means of the TOP ZERO and on the other on a value 10 by means of the TOP ONE. Such a construction makes it possible to significantly increase the reliability of the coder.

The embodiments of the invention described hereinbefore with reference to the drawings have the advantage of a substantially identical information density for each of the coder tracks. In addition, the coder no longer has half-spacings.

What is claimed is:

1. Coder for measuring relative movements between a first and a second objects comprising:

a measuring rule (R1, R3, R5, R7) carried by the first object and having at least two tracks (X, Y), each provided with a plurality of marks, at least two mark readers (LX, LY) carried by the second object, each of the tracks of the measuring rule being read by at least one mark reader, the latter being able to detect the marks of the track with which it is associated and processing means (CX, CY, CL) connected to the mark readers, characterized in that all the tracks have substantially the same number of marks, that each mark has a start limit (14, 15, 16) and an end limit (17, 18, 19), each of which defines a spacing change (P14, P15) on the measuring rule and that the marks of the measuring rule consist of a plurality of simple marks all of which have substantially identical characteristics and at least two specific marks (M1–M5) respectively located on two distinct tracks of the measuring rule for indicating at least a reference position of the rule and each having at least one characteristic differing from the characteristics of the simple marks, the specific marks having a length, in the displacement direction, greater than or less than that of the simple marks, the said length corresponding to the characteristic which makes different the set of simple marks and specific marks from all the tracks defining a succession of regular spacings along the rule wherein the at least two specific marks define a single reference for the measuring rule.

2. Coder according to claim 1, characterized in that the measuring rule has a specific mark on each track, each of the said specific marks having a length different both from the simple marks and the other specific marks.

3. Coder according to claim 2 characterized in that the readers and marks are disposed such that edges of different marks are not read simultaneously.

4. Coder according to claim 1, characterized in that the characteristic differentiating the simple marks and the specific mark is the optical marking density.

5. Coder according to claim 1, characterized in that the processing means comprise, for each reader, an amplifier (AX, AY) and at least one former (CX, CY) for transforming the output signal of the reader into a digital signal and means (CL) for analyzing the digital signals from the formers.

* * * * *